United States Patent
Banba et al.

(10) Patent No.: US 10,089,513 B2
(45) Date of Patent: Oct. 2, 2018

(54) WIRING BOARD FOR FINGERPRINT SENSOR

(71) Applicant: KYOCERA Corporation, Kyoto-shi, Kyoto (JP)

(72) Inventors: Yudai Banba, Ayabe (JP); Sumiko Noguchi, Ayabe (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/604,926

(22) Filed: May 25, 2017

(65) Prior Publication Data
US 2017/0344790 A1   Nov. 30, 2017

(30) Foreign Application Priority Data

May 30, 2016   (JP) .................................. 2016-106895
Feb. 22, 2017   (JP) .................................. 2017-030655

(51) Int. Cl.
*G06K 9/00*   (2006.01)
*H05K 1/11*   (2006.01)

(52) U.S. Cl.
CPC .......... *G06K 9/00013* (2013.01); *H05K 1/112* (2013.01); *H05K 2201/10151* (2013.01)

(58) Field of Classification Search
CPC .............. G06K 9/00013; H05K 1/112; H05K 2201/10151
See application file for complete search history.

(56) References Cited

U.S. PATENT DOCUMENTS

| 4,161,743 | A | * | 7/1979 | Yonezawa | H01L 21/314 |
| | | | | | 257/636 |
| 5,828,773 | A | * | 10/1998 | Setlak | G06K 9/0002 |
| | | | | | 382/126 |
| 5,869,791 | A | * | 2/1999 | Young | G06F 3/0414 |
| | | | | | 178/18.01 |

(Continued)

FOREIGN PATENT DOCUMENTS

CN   204926126 U   12/2015
JP   2001-046359 A   2/2001
(Continued)

OTHER PUBLICATIONS

Korean Office Action with English concise explanation, Korean Patent Application No. 2017-0066094, dated Nov. 1, 2017, 7 pgs.

*Primary Examiner* — Manav Seth
(74) *Attorney, Agent, or Firm* — Volpe and Koenig, P.C.

(57) ABSTRACT

A wiring board for a fingerprint sensor includes an insulating board including insulating layers; outer strip electrodes disposed on the insulating layer in an uppermost layer, and side by side in a first direction; inner strip electrodes disposed on the insulating layer in a next layer contacting the insulating layer in the uppermost layer, and side by side in a second direction orthogonal to the first direction; a pad electrode disposed on the insulating layer in the uppermost layer, and on the inner strip electrodes and between the outer strip electrodes; and a via conductor extending through the insulating layer in an outermost layer between the pad electrode and the inner strip electrodes and electrically connecting the pad electrode and the inner strip electrodes to each other. The via conductor has an elliptical shape that is long in the first direction in top view.

3 Claims, 7 Drawing Sheets

(56) References Cited

U.S. PATENT DOCUMENTS

| | | | | |
|---|---|---|---|---|
| 6,114,862 | A * | 9/2000 | Tartagni | G01B 7/004 |
| | | | | 324/661 |
| 6,462,563 | B1 * | 10/2002 | Kawahara | G06K 9/0002 |
| | | | | 324/662 |
| 7,400,750 | B2 * | 7/2008 | Nam | G06K 9/0002 |
| | | | | 382/124 |
| 7,894,644 | B2 * | 2/2011 | Padinger | A61B 5/1172 |
| | | | | 257/40 |
| 8,536,882 | B2 * | 9/2013 | Yeh | G06F 3/045 |
| | | | | 324/691 |
| 9,058,511 | B2 * | 6/2015 | Chou | G06K 9/0002 |
| 9,702,902 | B2 * | 7/2017 | Burger | G01R 1/0408 |
| 9,886,614 | B2 * | 2/2018 | Noguchi | G06K 9/0002 |
| 9,916,798 | B2 * | 3/2018 | Shibata | G09G 3/3614 |
| 9,928,400 | B2 * | 3/2018 | Ohsumi | G06K 9/0002 |
| 2011/0211737 | A1 * | 9/2011 | Krupka | G06F 17/30247 |
| | | | | 382/118 |
| 2014/0182889 | A1 * | 7/2014 | Shin | H05K 3/4673 |
| | | | | 174/251 |
| 2015/0027758 | A1 * | 1/2015 | Maeda | H05K 3/421 |
| | | | | 174/255 |
| 2015/0101851 | A1 * | 4/2015 | Ko | H05K 1/0306 |
| | | | | 174/258 |
| 2015/0250050 | A1 * | 9/2015 | Lee | H05K 1/185 |
| | | | | 361/761 |
| 2016/0195983 | A1 * | 7/2016 | Miyake | G06F 3/0416 |
| | | | | 345/174 |

FOREIGN PATENT DOCUMENTS

| | | |
|---|---|---|
| JP | 2002-299555 A | 10/2002 |
| TW | 201237772 A | 9/2012 |

\* cited by examiner

WIRING BOARD FOR FINGERPRINT SENSOR

BACKGROUND

Technical Field

The present disclosure relates to a wiring board for a fingerprint sensor.

SUMMARY

Accordingly, it is an object of the present disclosure to provide a wiring board for a fingerprint sensor that is capable of further increasing the sensitivity with which a fingerprint is read, the wiring board for a fingerprint sensor including pad electrodes that are disposed between outer strip electrodes and that are connected to inner strip electrodes via via conductors.

A wiring board for a fingerprint sensor according to the present disclosure includes an insulating board that includes a plurality of insulating layers laminated on each other; a plurality of outer strip electrodes for reading a fingerprint, the plurality of outer strip electrodes being disposed on the insulating layer in an uppermost layer and being disposed side by side in a first direction; a plurality of inner strip electrodes for reading the fingerprint, the plurality of inner strip electrodes being disposed on the insulating layer in a next layer that contacts the insulating layer in the uppermost layer and being disposed side by side in a second direction orthogonal to the first direction; a pad electrode that is disposed on the insulating layer in the uppermost layer and that is disposed on the inner strip electrodes and between the outer strip electrodes; and a via conductor that extends through the insulating layer in an outermost layer between the pad electrode and the inner strip electrodes and that electrically connects the pad electrode and the inner strip electrodes to each other. The via conductor has an elliptical shape that is long in the first direction in top view.

According to the wiring board for a fingerprint sensor of the present disclosure, the via conductors that electrically connect the inner strip electrodes and the pad electrodes disposed between the outer strip electrodes have elliptical shapes that are long in the first direction along the outer strip electrodes in top view, so that opposing areas of the via conductors and the outer strip electrodes are large. As a result, electrostatic coupling between the outer strip electrodes and the inner strip electrodes is further increased, so that it is possible to provide a wiring board for a fingerprint sensor that can further increase the sensitivity with which a fingerprint is read.

DESCRIPTION OF THE PREFERRED EMBODIMENTS

Figure 1:
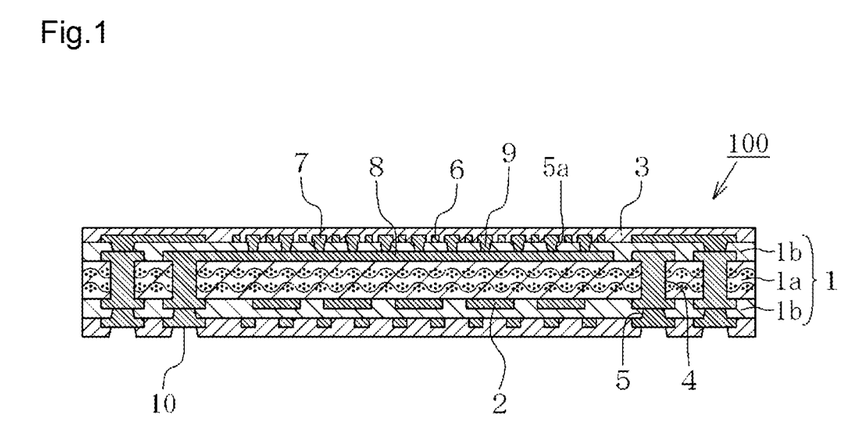
FIG. 1 is a sectional schematic view of a wiring board for a fingerprint sensor according to an embodiment of the present disclosure.

Next, a wiring board for a fingerprint sensor according to an embodiment of the present disclosure is described with reference to FIGS. 1 to 4. As shown in FIG. 1, a wiring board 100 according to the embodiment includes an insulating board 1, wiring conductors 2, and solder resist layers 3.

The insulating board 1 has a structure in which buildup insulating layers 1b are laminated, one on each of an upper surface and a lower surface of a core insulating layer 1a. The core insulating layer 1a is made of thermosetting resin containing glass cloth. Each buildup insulating layer 1b is made of thermosetting resin not containing glass cloth. Examples of the thermosetting resin for the insulating layers 1b include epoxy resin and bismaleimide-triazine resin. The thermosetting resin may contain a dispersed inorganic insulator filler such as aluminum hydroxide or silica. The thickness of the core insulating layer 1a is 30 μm to 400 μm. The core insulating layer 1a has a plurality of through holes 4. The diameter of each through hole 4 is approximately 70 μm to 100 μm. The thickness of each buildup insulating layer 1b is 10 μm to 20 μm. The buildup insulating layers 1b have a plurality of via holes 15. The diameter of each via hole 5 is 20 μm to 70 μm.

The wiring conductors 2 are adhered to the upper and lower surfaces of the core insulating layer 1a, inner sides of the through holes 4, surfaces of the corresponding buildup insulating layers 1b, and inner sides of the via holes 5. Each wiring conductor 2 is made of plated copper. The thickness of the wiring conductors 2 adhered to the upper surface and the lower surface of the core insulating layer 1a is approximately 10 μm to 20 μm. The thickness of the wiring conductor 2 adhered to a surface of the buildup insulating layer 1b is 5 μm to 50 μm.

Figure 2:
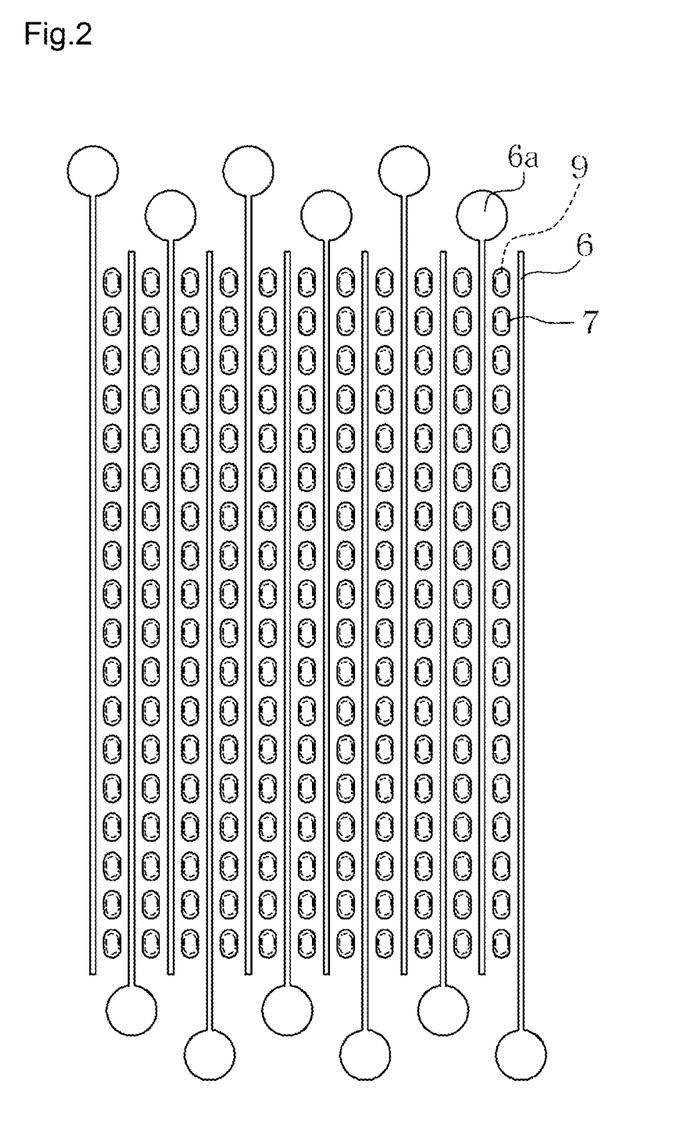
FIG. 2 is a top view of outer strip electrodes and pad electrodes of the wiring board for a fingerprint sensor according to the embodiment of the present disclosure.

Parts of the wiring conductors 2 adhered to the surface of the upper buildup insulating layer 1b include outer strip electrodes 6 for reading a fingerprint. As illustrated in FIG. 2, the outer strip electrodes 6 each have a thin strip pattern including a land 6a at its end portion, and are disposed side by side and parallel to each other in a first direction. The width of a strip pattern portion of each outer strip electrode 6 is approximately 5 μm to 20 μm. The interval between adjacent strip pattern portions of the outer strip electrodes 6 is approximately 50 μm to 65 μm.

Parts of the wiring conductor 2 adhered to the surface of the upper buildup insulating layer 1b include a plurality of pad electrodes 7 between the outer strip electrodes 6. A dimension of each pad electrode 7 in the first direction is approximately 40 μm to 65 μm, and a dimension of each pad electrode 7 in a second direction orthogonal to the first direction is approximately 30 μm to 45 μm. The interval between the outer strip electrodes 6 is 10 μm to 20 μm. The pad electrodes 7 are positioned on inner strip electrodes 8

(described later). The short diameter of each pad electrode 7 is 20 μm to 40 μm, and the long diameter of each pad electrode 7 is 30 μm to 60 μm. The pad electrodes 7 are connected to the inner strip electrodes 8 via via conductors 9 with which elliptical via holes 5*a* that are long in the first direction are filled.

Figure 3:
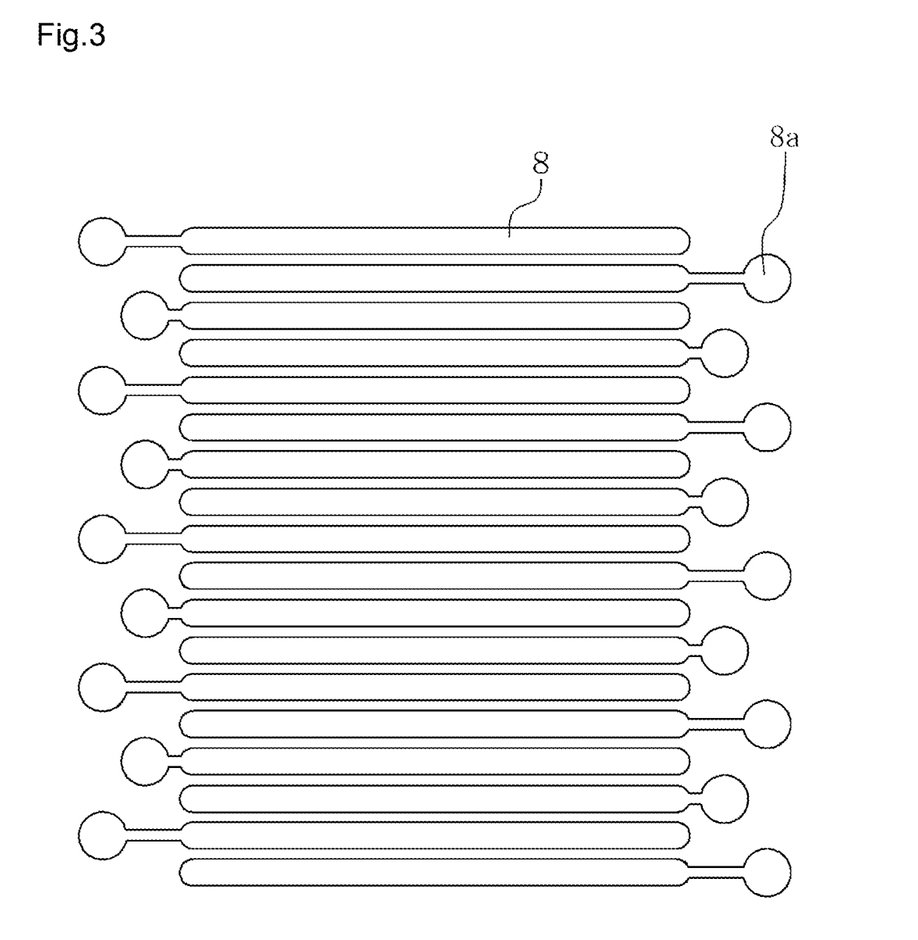
FIG. 3 is a top view of inner strip electrodes of the wiring board for a fingerprint sensor according to the embodiment of the present disclosure.

Referring back to FIG. 1, parts of the wiring conductor 2 adhered to the upper surface of the core insulating layer 1*a* form the inner strip electrodes 8 for reading a fingerprint. As illustrated in FIG. 3, the inner strip electrodes 8 each have a thin strip pattern including a land 8*a* at its end portion, and are disposed side by side and parallel to each other in the second direction at right angles to the first direction. The width of a strip pattern portion of each inner strip electrode 8 is approximately 30 μm to 65 μm. The interval between adjacent strip pattern portions of the inner strip electrodes 8 is approximately 15 μm to 40 μm.

Figure 4:
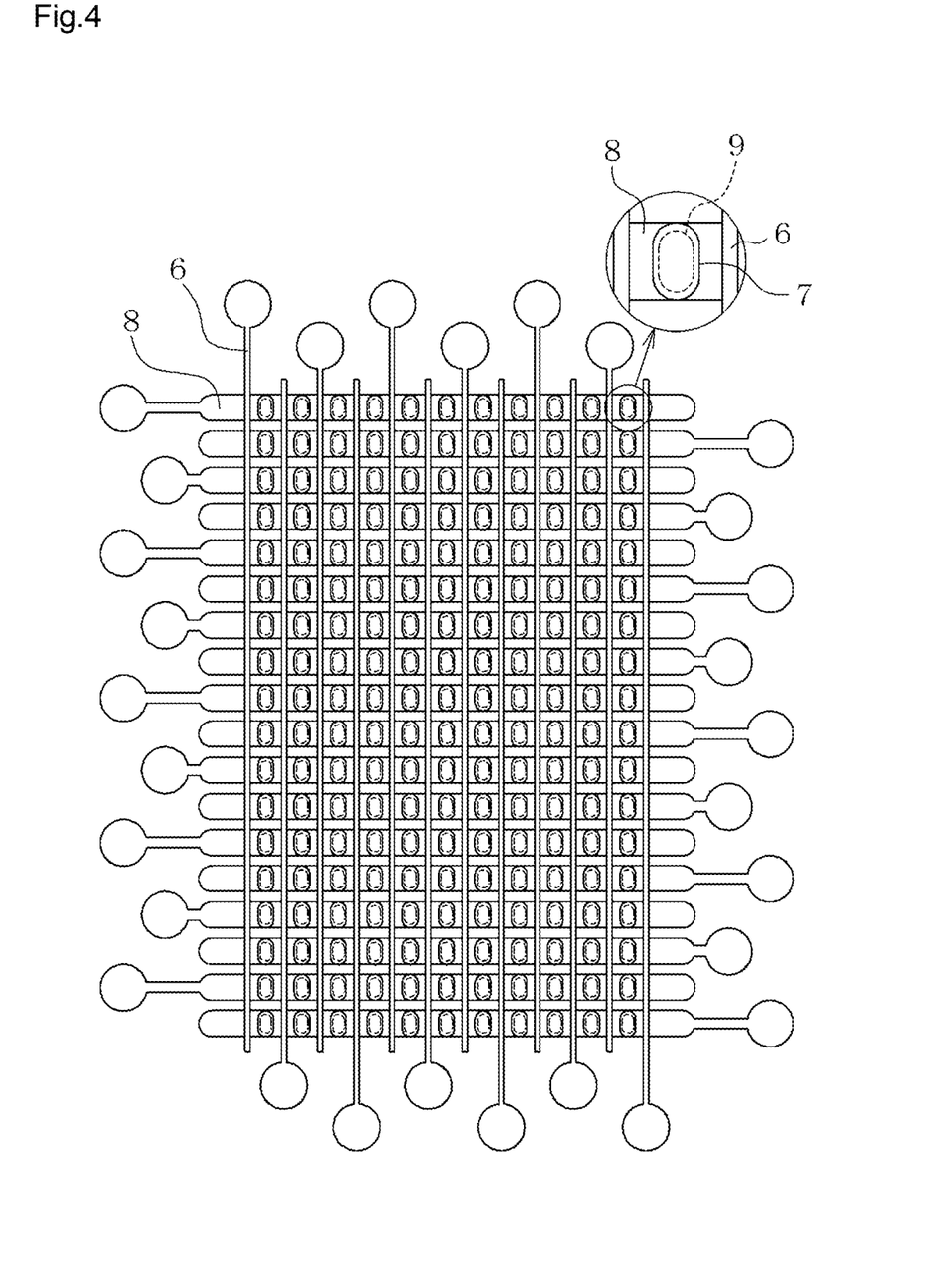
FIG. 4 is a top view showing a state in which the outer strip electrodes, the pad electrodes, and the inner strip electrodes vertically overlap each other in the wiring board for a fingerprint sensor according to the embodiment of the present disclosure.

As illustrated in FIG. 4, the outer strip electrodes 6 and the inner strip electrodes 8 vertically overlap each other and orthogonally intersect each other. A horizontal interval between the pad electrodes 7 and the outer strip electrodes 6 is 5 μm to 20 μm.

Referring back to FIG. 1, parts of the wiring conductor 2 adhered to a surface of the lower buildup insulating layer 1*b* form external connection pads 10. Each external connection pad 10 has a circular shape having a diameter of 200 μm to 500 μm. Predetermined ones of the external connection pads 10, the outer strip electrodes 6, and the inner strip electrodes 8 are connected to each other via the wiring conductors 2.

The solder resist layers 3 are adhered to and cover the upper buildup insulating layer 1*b*, the lower buildup insulating layer 1*b*, and the wiring conductors 2 on their surfaces. Each solder resist layer 3 is made of thermosetting resin. Each solder resist layer 3 contains dispersed silica powder as filler. The thickness of the solder resist layers 3 on the surfaces of the wiring conductors 2 is approximately 5 μm to 20 μm. The upper solder resist layer 3 completely covers the wiring conductors 2. The lower solder resist layer 3 has openings that allow the external connection pads 10 to be exposed.

When a person puts his/her finger on an upper surface of the wiring board 100 for a fingerprint sensor and a voltage is applied to the outer strip electrodes 6, electrostatic capacitance is generated between the outer strip electrodes 6 and the surface of the person's finger opposing each other with the upper solder resist layer 3 interposed therebetween. The electrostatic capacitance is high at a projected portion of the fingerprint, and is low at a recessed portion of the fingerprint. The difference between the electrostatic capacitances is detected by scanning the plurality of outer strip electrodes 6 and the plurality of inner strip electrodes 7 as a result of sequentially applying a voltage to them. This makes it possible to read the fingerprint by performing arithmetic processing on the detected difference with an external processor.

In the wiring board for a fingerprint sensor 100, when the pad electrodes 7 that are electrically connected to the inner strip electrodes 8 via the via conductors 9 are disposed between the outer strip electrodes 6, electrostatic coupling between the outer strip electrodes 6 and the inner strip electrodes 8 is increased, so that a fingerprint can be read with high sensitivity. The via conductors 9 that electrically connect the pad electrodes 7 and the inner strip electrodes 8 have elliptical shapes that are long in the first direction along the outer strip electrodes 6 in top view, so that, compared to existing circular via conductors, opposing areas of the via conductors 9 and the outer strip electrodes 6 are large. As a result, electrostatic coupling between the outer strip electrodes 6 and the inner strip electrodes 8 is further increased, so that it is possible to provide a wiring board for a fingerprint sensor that can further increase the sensitivity with which a fingerprint is read.

Figure 5:
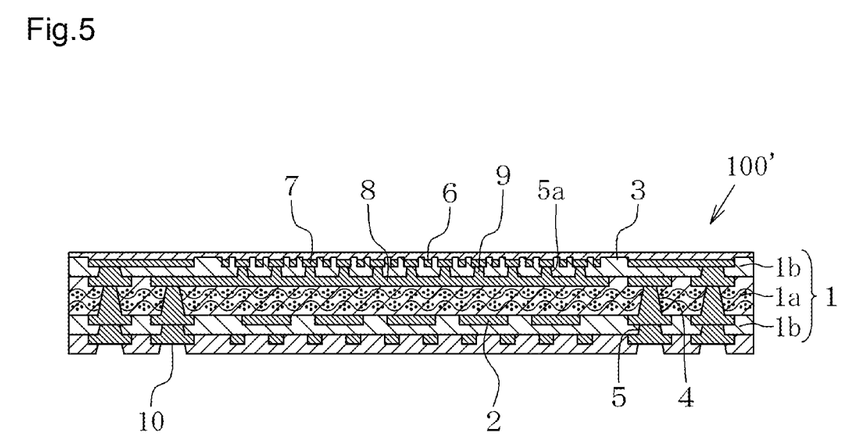
FIG. 5 is a sectional schematic view of a wiring board for a fingerprint sensor according to another embodiment of the present disclosure.

The present disclosure is not limited to the above-described embodiment. Various changes can be made within a scope that does not depart from the gist of the present disclosure. FIG. 5 illustrates a wiring board for a fingerprint sensor according to another embodiment of the present disclosure. Portions of a wiring board 100' for a fingerprint sensor shown in FIG. 5 that are the same as those according to the above-described embodiment are given the same reference numerals, and are not described in detail below.

This embodiment differs from the above-described embodiment in that outer strip electrodes 6 and pad electrodes 7 are embedded in an upper surface of an insulating layer 1*b* in an uppermost layer. Upper surfaces of the embedded outer strip electrodes 6 and pad electrodes 7 are disposed desirably 0.1 μm to 3 μm below the upper surface of the insulating layer 1*b* in the uppermost layer.

When the upper surfaces of the outer strip electrodes 6 and the upper surfaces of the pad electrodes 7 are embedded in the upper surface of the insulating layer 1*b* in the uppermost layer so as to be disposed 0.1 μm to 3 μm below the upper surface of the insulating layer 1*b* in the uppermost layer, even if the solder resist layer 3 that covers the outer strip electrodes 6 and the pad electrodes 7 is thin with a thickness of, for example, 6 μm or less, the sizes of projections and recesses of the surface of the solder resist layer 3 can be made 2 μm or less. In this way, when the solder resist layer 3 that covers the outer strip electrodes 6 and the pad electrodes 7 is thin with a thickness of, for example, 6 μm or less, and when the sizes of the projections and recesses of the surface of the solder resist layer 3 are 2 μm or less, it is possible to detect a fingerprint with good detection sensitivity and with good detection precision.

A method of producing the wiring board 100' for a fingerprint sensor is described with reference to FIGS. 6A to 6E and FIGS. 7F to 7J. FIGS. 6A to 6E and FIGS. 7F to 7J illustrate a state in which the wiring board 100' for a fingerprint sensor shown in FIG. 5 is produced with upper and lower sides thereof reversed.

Figure 6A:
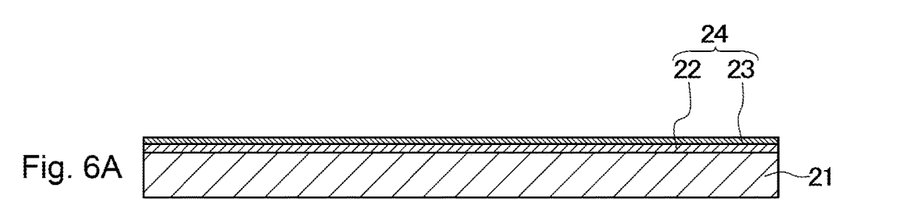
FIGS. 6A to 6E are sectional schematic views of steps for describing a method of producing the wiring board for a fingerprint sensor shown in FIG. 5.

First, as shown in FIG. 6A, a copper foil 24 with a carrier that is laminated on an upper surface of a flat supporting substrate 21 is prepared. The supporting substrate 21 is, for example, an epoxy resin plate containing glass cloth. The copper foil 24 with a carrier includes a carrier copper foil 22 and a copper foil 23 that can be peeled off from each other and that are laminated on each other.

Figure 6B:
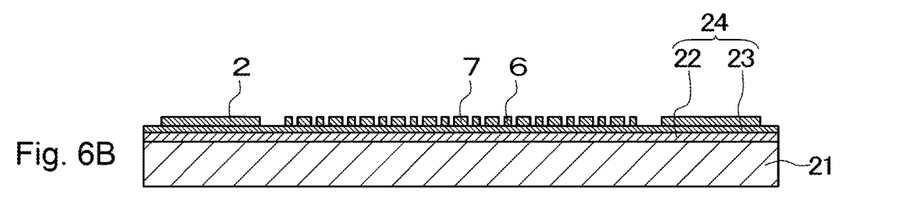

Then, as shown in FIG. 6B, a wiring conductor 2 in an uppermost layer is formed on a surface of the copper foil 23. The wiring conductor 2 includes outer strip electrodes 6 and pad electrodes 7. The wiring conductor 2 is formed by a known semi-additive method.

Figure 6C:
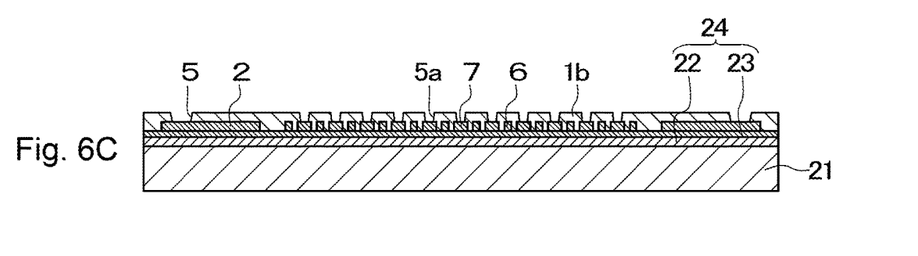

Next, as shown in FIG. 6C, an insulating layer 1*b* in the uppermost layer is laminated on the surface of the copper foil 23 and a surface of the wiring conductor 2 in the uppermost layer. A plurality of via holes 5 including via holes 5*a* is formed in the insulating layer 1*b* in the uppermost layer by laser processing.

Figure 6D:
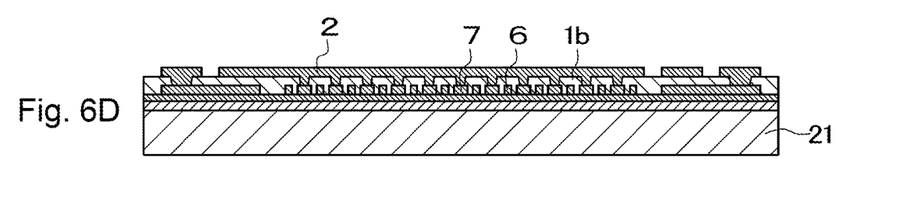

Next, as shown in FIG. 6D, a wiring conductor 2 in a next layer is formed on a surface of the insulating layer 1*b* in the uppermost layer and in the via holes 5.

Figure 6E:
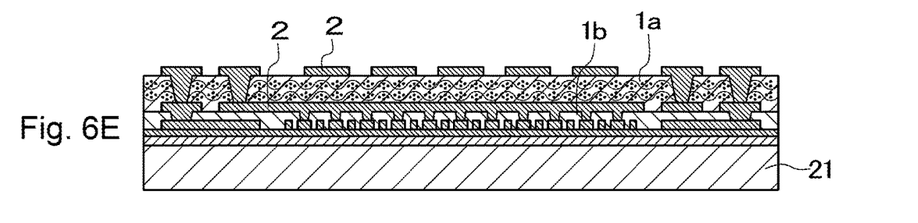

Next, as shown in FIG. 6E, an insulating layer 1*a* and a wiring conductor 2 in a next layer are laminated on the surface of the insulating layer 1b on which the wiring conductor 2 has been formed.

Figure 7F:
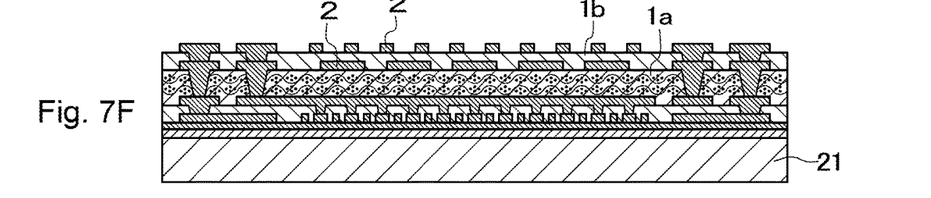
FIGS. 7F to 7J are sectional schematic views of steps for describing the method of producing the wiring board for a fingerprint sensor shown in FIG. 5.

Next, as shown in 7F, an insulating layer 1b in a lowermost layer and a wiring conductor 2 in the lowermost layer are formed on a surface of the insulating layer 1a on which the wiring conductor 2 has been formed.

Figure 7G:
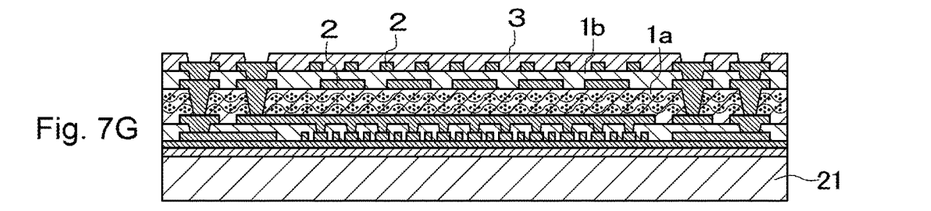

Next, as shown in FIG. 7G, a lower solder resist layer 3 is formed on a surface of the insulating layer 1b in the lowermost layer on which the wiring conductor 2 has been formed.

Figure 7H:
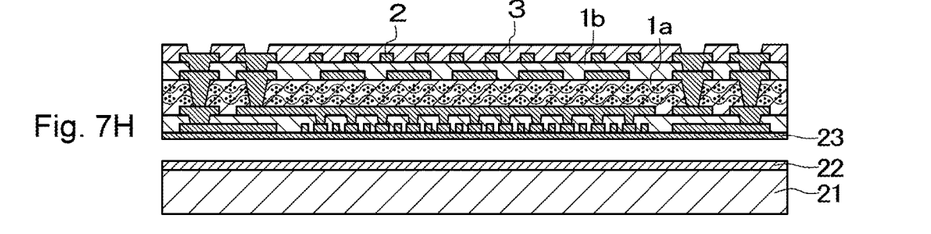

Next, as shown in FIG. 7H, the carrier copper foil 22 is peeled off from the copper foil 23 to remove the supporting substrate 21 together with the carrier copper foil 22.

Figure 7I:
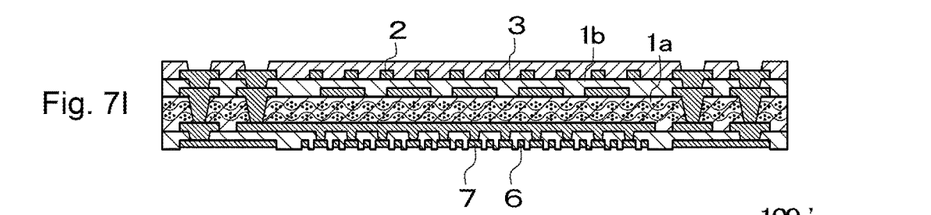

Next, as shown in FIG. 7I, the copper foil 23 is removed by etching, and the outer strip electrodes 6 and the pad electrodes 7 are exposed. At this time, surfaces of the outer strip electrodes 6 and surfaces of the pad electrodes 7 are slightly etched by the etching, so that the exposed surfaces of the outer strip electrodes 6 and the exposed surfaces of the pad electrodes 7 are recessed from a surface of the insulating layer 1b in the uppermost layer by 0.1 to 3 µm.

Figure 7J:
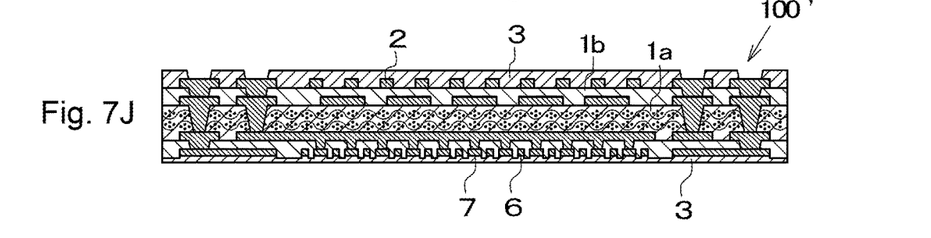

Lastly, as shown in FIG. 7J, an upper solder resist layer 3 is adhered to the surface of the insulating layer 1b in the uppermost layer and a surface of the wiring conductor 2 in the uppermost layer, so that the wiring board 100' for a fingerprint sensor is completed.

What is claimed is:

1. A wiring board for a fingerprint sensor, comprising:
    an insulating board that comprises a plurality of insulating layers laminated on each other;
    a plurality of outer strip electrodes for reading a fingerprint, the plurality of outer strip electrodes being disposed on the insulating layer in an uppermost layer and being disposed side by side in a first direction;
    a plurality of inner strip electrodes for reading the fingerprint, the plurality of inner strip electrodes being disposed on the insulating layer in a next layer that contacts the insulating layer in the uppermost layer and being disposed side by side in a second direction orthogonal to the first direction;
    a pad electrode that is disposed on the insulating layer in the uppermost layer and that is disposed on the inner strip electrodes and between the outer strip electrodes; and
    a via conductor that extends through the insulating layer in an outermost layer between the pad electrode and the inner strip electrodes and that electrically connects the pad electrode and the inner strip electrodes to each other,
    wherein the via conductor has an elliptical shape that is long in the first direction in top view.

2. The wiring board according to claim 1, wherein the outer strip electrodes and the pad electrode are embedded in an upper surface of the insulating layer in the uppermost layer, and
    wherein the insulating layer, the outer strip electrodes, and the pad electrode are covered by a solder resist layer having a flat surface.

3. The wiring board according to claim 2, wherein the outer strip electrodes and the pad electrode are embedded in the upper surface of the insulating layer in the uppermost layer with upper surfaces of the outer strip electrodes and an upper surface of the pad electrode being 0.1 µm to 3 µm below the upper surface of the insulating layer in the uppermost layer, and
    wherein a thickness of the solder resist layer that covers the upper surfaces of the outer strip electrodes and the upper surface of the pad electrode is 6 µm or less.

* * * * *